(12) United States Patent
Chaney et al.

(10) Patent No.: US 7,446,326 B2
(45) Date of Patent: Nov. 4, 2008

(54) TECHNIQUE FOR IMPROVING ION IMPLANTER PRODUCTIVITY

(75) Inventors: Craig R. Chaney, Rockport, MA (US); Russell J. Low, Rowley, MA (US); Jonathan Gerald England, Horsham (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 477 days.

(21) Appl. No.: 11/394,825

(22) Filed: Mar. 31, 2006

(65) Prior Publication Data

US 2007/0045570 A1   Mar. 1, 2007

Related U.S. Application Data

(60) Provisional application No. 60/712,395, filed on Aug. 31, 2005.

(51) Int. Cl.
*G21K 5/10* (2006.01)

(52) U.S. Cl. .............. 250/492.21; 250/492.1

(58) Field of Classification Search .... 250/492.1–492.3
See application file for complete search history.

(56) References Cited

U.S. PATENT DOCUMENTS

| | | | |
|---|---|---|---|
| 3,904,505 A * | 9/1975 | Aisenberg .............. 204/298.04 |
| 4,595,837 A | 6/1986 | Wu et al. |
| 4,608,513 A | 8/1986 | Thompson |
| 4,698,236 A * | 10/1987 | Kellogg et al. .............. 427/526 |
| 4,754,200 A | 6/1988 | Plumb et al. |
| 4,891,525 A | 1/1990 | Frisa et al. |
| 4,914,305 A | 4/1990 | Benveniste et al. |
| 5,023,458 A | 6/1991 | Benveniste et al. |
| 5,026,997 A | 6/1991 | Benveniste |
| 5,089,746 A | 2/1992 | Rosenblum et al. |
| 5,107,170 A | 4/1992 | Ishikawa et al. |
| 5,189,303 A | 2/1993 | Tanjyo et al. |
| 5,218,210 A | 6/1993 | McIntyre, Jr. et al. |
| 5,262,652 A | 11/1993 | Bright et al. |
| 5,306,921 A | 4/1994 | Tanaka et al. |
| 5,315,118 A | 5/1994 | Mous |
| 5,420,415 A | 5/1995 | Trueira |
| 5,497,006 A | 3/1996 | Sferlazzo et al. |
| 5,517,077 A | 5/1996 | Bright et al. |
| 5,523,652 A | 6/1996 | Sferlazzo et al. |
| 5,554,852 A | 9/1996 | Bright et al. |
| 5,661,308 A | 8/1997 | Benveniste et al. |
| 5,703,372 A | 12/1997 | Horsky et al. |
| 5,736,743 A | 4/1998 | Benveniste |

(Continued)

FOREIGN PATENT DOCUMENTS

WO   WO 2005/093777 A2   10/2005

(Continued)

*Primary Examiner*—Jack I Berman
*Assistant Examiner*—Andrew Smyth

(57) ABSTRACT

A technique for improving ion implanter productivity is disclosed. In one particular exemplary embodiment, the technique may be realized as a method for improving productivity of an ion implanter having an ion source chamber. The method may comprise supplying a gaseous substance to the ion source chamber, the gaseous substance comprising one or more reactive species for generating ions for the ion implanter. The method may also comprise stopping the supply of the gaseous substance to the ion source chamber. The method may further comprise supplying a hydrogen containing gas to the ion source chamber for a period of time after stopping the supply of the gaseous substance.

19 Claims, 3 Drawing Sheets

U.S. PATENT DOCUMENTS

| | | | |
|---|---|---|---|
| 5,763,890 | A | 6/1998 | Cloutier et al. |
| 5,763,895 | A | 6/1998 | Tien et al. |
| 5,883,393 | A | 3/1999 | Tien et al. |
| 5,886,355 | A | 3/1999 | Bright et al. |
| 5,914,494 | A | 6/1999 | Abbott |
| 5,925,886 | A | 7/1999 | Seki et al. |
| 5,977,552 | A | 11/1999 | Foad |
| 6,016,036 | A | 1/2000 | Brailove |
| 6,037,600 | A | 3/2000 | Tung |
| 6,060,718 | A | 5/2000 | Brailove et al. |
| 6,060,836 | A | 5/2000 | Maeno et al. |
| 6,084,241 | A | 7/2000 | Sitter |
| 6,107,634 | A | 8/2000 | Horsky |
| 6,135,128 | A | 10/2000 | Graf et al. |
| 6,169,288 | B1 | 1/2001 | Horino et al. |
| 6,184,532 | B1 | 2/2001 | Dudnikov et al. |
| 6,184,624 | B1 | 2/2001 | Inouchi |
| 6,204,508 | B1 | 3/2001 | Chen et al. |
| 6,215,125 | B1 | 4/2001 | Chen et al. |
| 6,239,440 | B1 | 5/2001 | Abbott |
| 6,259,210 | B1 | 7/2001 | Wells |
| 6,288,403 | B1 | 9/2001 | Horsky et al. |
| 6,291,827 | B1 | 9/2001 | Tsai et al. |
| 6,294,862 | B1 | 9/2001 | Brailove |
| 6,331,713 | B1 | 12/2001 | Smick et al. |
| 6,355,933 | B1 | 3/2002 | Tripsas et al. |
| 6,392,244 | B1 * | 5/2002 | Grannen et al. ........ 250/492.21 |
| 6,479,828 | B2 | 11/2002 | Perel |
| 6,497,744 | B2 | 12/2002 | Yamashita |
| 6,515,290 | B1 | 2/2003 | Rzeszut et al. |
| 6,525,482 | B2 | 2/2003 | Miyamoto |
| 6,555,831 | B1 | 4/2003 | Konishi et al. |
| 6,559,462 | B1 | 5/2003 | Carpenter et al. |
| 6,570,166 | B2 | 5/2003 | Yamashita |
| 6,576,909 | B2 | 6/2003 | Donaldson et al. |
| 6,583,427 | B1 | 6/2003 | Edmonds et al. |
| 6,583,544 | B1 * | 6/2003 | Horsky et al. ............ 313/359.1 |
| 6,593,580 | B2 | 7/2003 | Miyabayashi |
| 6,633,133 | B1 | 10/2003 | Ishida |
| 6,635,889 | B2 | 10/2003 | Tsukihara et al. |
| 6,639,223 | B2 | 10/2003 | Reyes |
| 6,639,229 | B2 | 10/2003 | Chakor |
| 6,646,268 | B2 | 11/2003 | Murakoshi et al. |
| 6,661,014 | B2 | 12/2003 | Reyes |
| 6,664,547 | B2 | 12/2003 | Benveniste |
| 6,664,548 | B2 | 12/2003 | Benveniste et al. |
| 6,670,623 | B2 | 12/2003 | Vella |
| 6,683,317 | B1 | 1/2004 | Simmons et al. |
| 6,686,601 | B2 | 2/2004 | Murrell et al. |
| 6,693,289 | B1 | 2/2004 | March et al. |
| 6,696,793 | B2 | 2/2004 | Yamashita |
| 6,756,600 | B2 | 6/2004 | Ng et al. |
| 6,768,121 | B2 * | 7/2004 | Horsky et al. ............... 250/427 |
| 6,777,686 | B2 | 8/2004 | Olson et al. |
| 6,777,699 | B1 | 8/2004 | Miley et al. |
| 6,797,964 | B2 | 9/2004 | Yamashita |
| 6,815,690 | B2 | 11/2004 | Veerasamy et al. |
| 6,818,909 | B2 | 11/2004 | Murrell et al. |
| 6,847,043 | B2 | 1/2005 | Murrell et al. |
| 6,878,946 | B2 | 4/2005 | Farley et al. |
| 6,905,947 | B2 | 6/2005 | Goldberg |
| 2004/0000651 | A1 * | 1/2004 | Horsky et al. .......... 250/492.21 |

FOREIGN PATENT DOCUMENTS

| | | |
|---|---|---|
| WO | WO 2005/093777 A3 | 10/2005 |
| WO | WO 2006/015072 A2 | 2/2006 |

* cited by examiner

TECHNIQUE FOR IMPROVING ION IMPLANTER PRODUCTIVITY

CROSS-REFERENCE TO RELATED APPLICATIONS

This patent application claims priority to U.S. Provisional Patent Application No. 60/712,395, filed Aug. 31, 2005, which is hereby incorporated by reference herein in its entirety.

FIELD OF THE DISCLOSURE

The present disclosure relates generally to ion implantation and, more particularly, to a technique for improving ion implanter productivity.

BACKGROUND OF THE DISCLOSURE

Ion implantation is a process for depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energies.

Recently, carbon and oxygen ion implants have become more prevalent in the manufacture of IC devices. Such implants provide improved transistor performance.

Carbon and oxygen ions are typically generated in a plasma-based ion source. FIG. 1 shows a typical ion source 100 in an ion implanter. The ion source 100 comprises an ion source chamber 102 with conductive chamber walls 114. At one end of the ion source chamber 102 there is a cathode 106 having a tungsten filament 104 located therein. The tungsten filament 104 is coupled to a first power supply 108 capable of supplying a high current. The high current may heat the tungsten filament 104 to cause thermionic emission of electrons. A second power supply 110 may bias the cathode 106 at a much higher potential than the tungsten filament 104 to cause the emitted electrons to accelerate to the cathode and so heat up the cathode 106. The heated cathode 106 may then emit electrons into the ion source chamber 102. A third power supply 112 may bias the chamber walls 114 with respect to the cathode 106 so that the electrons are accelerated at a high energy into the arc chamber. A source magnet (not shown) may create a magnetic field B inside the ion source chamber 102 to confine the energetic electrons, and a repeller 116 at the other end of the ion source chamber 102 may be biased at a same or similar potential as the cathode 106 to repel the energetic electrons. A gas source 118 may supply a reactive species (e.g., carbon dioxide, carbon monoxide, or oxygen, or a mixture of these gases) into the ion source chamber 102. The gas source 118 is not limited to gas bottles or reservoirs, but may comprise, for example, an oven that heats up a substance to produce a desired gas. For implantation of carbon or oxygen ions, carbon or oxygen containing reactive species are required. The energetic electrons may interact with the reactive species to produce a plasma 10. An extraction electrode (not shown) may then extract ions 12 from the plasma 10 for use in the ion implanter.

Existing methods for generating carbon or oxygen ions are problematic. One significant problem is a limited lifetime of ion sources running carbon or oxygen containing reactive species. Reaction by-products can accumulate inside an ion source chamber within a few hours, reducing ion output or causing the ion output to become unstable. Replacement or maintenance of an ion source chamber results in an extended downtime for an ion implanter. In addition, carbon or oxygen ion generation in an ion source chamber tend to cause a negative impact on subsequent ion generation processes carried out in that ion source chamber. For example, in one ion source chamber, a ten-hour carbon run can lead to a 50% reduction in productivity of boron ions and a 10% reduction in productivity of phosphorous ions. It is believed that carbon or oxygen ion generation has a "poisoning" effect on interior walls of an ion source chamber. The "poisoning" effect can adversely change surface chemistry for subsequent reactions in the ion source chamber. For example, fractionation rate for certain reactive species may be reduced significantly.

In view of the foregoing, it would be desirable to provide a technique for improving ion implanter productivity which overcomes the above-described inadequacies and shortcomings.

SUMMARY OF THE DISCLOSURE

A technique for improving ion implanter productivity is disclosed. In one particular exemplary embodiment, the technique may be realized as a method for improving productivity of an ion implanter having an ion source chamber. The method may comprise supplying a gaseous substance to the ion source chamber, the gaseous substance comprising one or more reactive species for generating ions for the ion implanter. The method may also comprise stopping the supply of the gaseous substance to the ion source chamber. The method may further comprise supplying a hydrogen containing gas to the ion source chamber for a period of time after stopping the supply of the gaseous substance.

In accordance with other aspects of this particular exemplary embodiment, the method may further comprise generating a plasma in the ion source chamber based on the one or more reactive species, thereby generating the ions.

In accordance with further aspects of this particular exemplary embodiment, the gaseous substance may comprise reactive species selected from a group consisting of carbon dioxide ($CO_2$), carbon monoxide (CO), oxygen ($O_2$), and any type of hydrocarbon.

In accordance with additional aspects of this particular exemplary embodiment, the method may further comprise generating a plasma in the ion source chamber based on the hydrogen containing gas, thereby reconditioning the ion source chamber.

In accordance with another aspect of this particular exemplary embodiment, the hydrogen containing gas may comprise one or more materials selected from a group consisting of phosphine ($PH_3$), ammonia ($NH_3$), arsine ($AsH_3$), methane ($CH_4$), and hydrogen ($H_2$). The hydrogen containing gas may further comprise a sputtering agent, such as one or more inert gases.

In accordance with yet another aspect of this particular exemplary embodiment, the period of time for supplying the hydrogen containing gas is determined based at least in part on an amount of time during which the gaseous substance is supplied to the ion source chamber.

In accordance with still another aspect of this particular exemplary embodiment, the method may further comprising the steps of: stopping supplying the hydrogen containing gas to the ion source chamber after the period of time, and supplying a second gaseous substance to the ion source chamber after stopping supplying the hydrogen containing gas. The period of time may be determined based at least in part on a composition of the second gaseous substance. The second gaseous substance may comprise one or more boron containing reactive species. Alternatively, the period of time for supplying the hydrogen containing gas may be determined based on one or more endpoint detection methods selected from a group consisting of mass spectrometry, residual gas analysis, emission spectroscopy, and absorption spectroscopy.

In another particular exemplary embodiment, the technique may be realized as a method for improving productivity of an ion implanter having an ion source chamber. The method may comprise supplying a gaseous substance to the ion source chamber, the gaseous substance comprising one or more reactive species for generating ions for the ion implanter. The method may also comprise stopping the supply of the gaseous substance to the ion source chamber. The method may further comprise supplying a chlorine containing gas to the ion source chamber for a period of time after stopping the supply of the gaseous substance.

In accordance with other aspects of this particular exemplary embodiment, the chlorine containing gas may comprise one or more materials selected from a group consisting of chlorine ($Cl_2$), hydrochloride (HCl), boron trichloride ($BCl_3$) and indium trichloride ($BCl_3$).

In yet another particular exemplary embodiment, the technique may be realized as a method for improving productivity of an ion implanter having an ion source chamber. The method may comprise supplying the ion source chamber with a gaseous mixture of a hydrogen containing gas and one or more reactive species. The method may also comprise generating a plasma in the ion source chamber based on the gaseous mixture, wherein the plasma contains ions generated from the one or more reactive species for use in the ion implanter, and wherein the plasma further removes one or more compounds from the ion source chamber.

In accordance with other aspects of this particular exemplary embodiment, the gaseous mixture may further comprise a sputtering agent, such as one or more inert gases.

In accordance with further aspects of this particular exemplary embodiment, the hydrogen containing gas may comprise one or more materials selected from a group consisting of phosphine ($PH_3$), ammonia ($NH_3$), arsine ($AsH_3$), and hydrogen ($H_2$).

In accordance with additional aspects of this particular exemplary embodiment, the hydrogen containing gas may account for 5-40% of a volume of the gaseous mixture.

In another particular exemplary embodiment, the technique may be realized as a method for improving productivity of an ion implanter having an ion source chamber. The method may comprise supplying a gaseous substance to the ion source chamber, the gaseous substance comprising one or more reactive species for generating carbon ions for the ion implanter. The method may also comprise stopping the supply of the gaseous substance to the ion source chamber. The method may further comprise supplying a hydrogen containing gas to the ion source chamber for a period of time after stopping the supply of the gaseous substance, the hydrogen containing gas also comprising at least one sputtering agent. The method may additionally comprise generating a plasma based on the hydrogen containing gas, wherein the plasma removes one or more metal compounds from the ion source chamber.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure may improve productivity of an ion implanter by reducing or eliminating ion source chamber poisoning. An ion source chamber may be cleaned or reconditioned with a hydrogen containing gas or a chlorine containing gas between ion generation processes. A variety of endpoint detection methods may be employed to know when to stop the cleaning process. Alternatively, a hydrogen containing gas may be mixed with or act as a diluent for one or more ion-generating reactive species, such that the ion source chamber is cleaned or reconditioned concurrently with an ion generation process. As a result, the ion source may become more productive in generating ions since a cleaning of the ion source chamber is less frequently required. When cleaning of the ion source chamber is required, it may be carried out more effectively and more efficiently.

Figure 2:
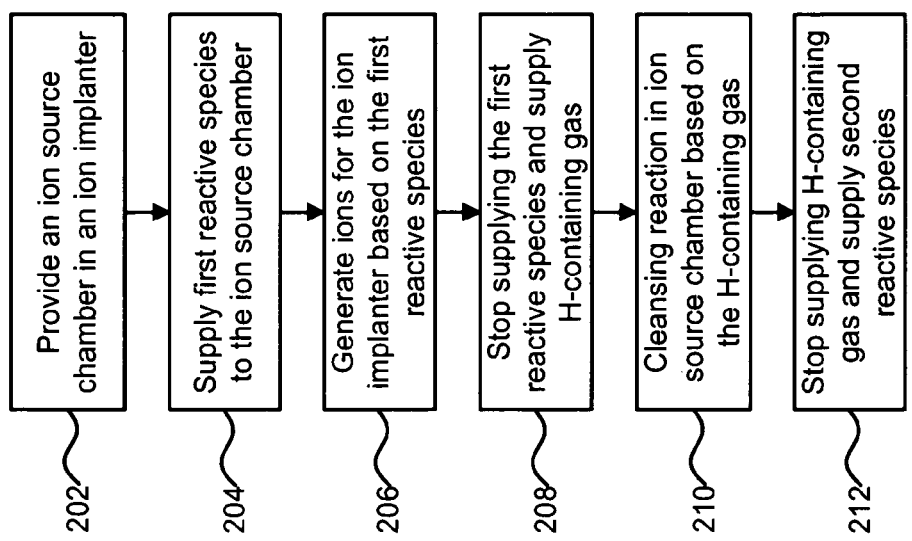
FIG. 2 shows a flow chart illustrating an exemplary method for improving ion implanter productivity in accordance with an embodiment of the present disclosure.

Referring to FIG. 2, there is shown a flow chart illustrating an exemplary method for improving ion implanter productivity in accordance with an embodiment of the present disclosure.

Figure 1:
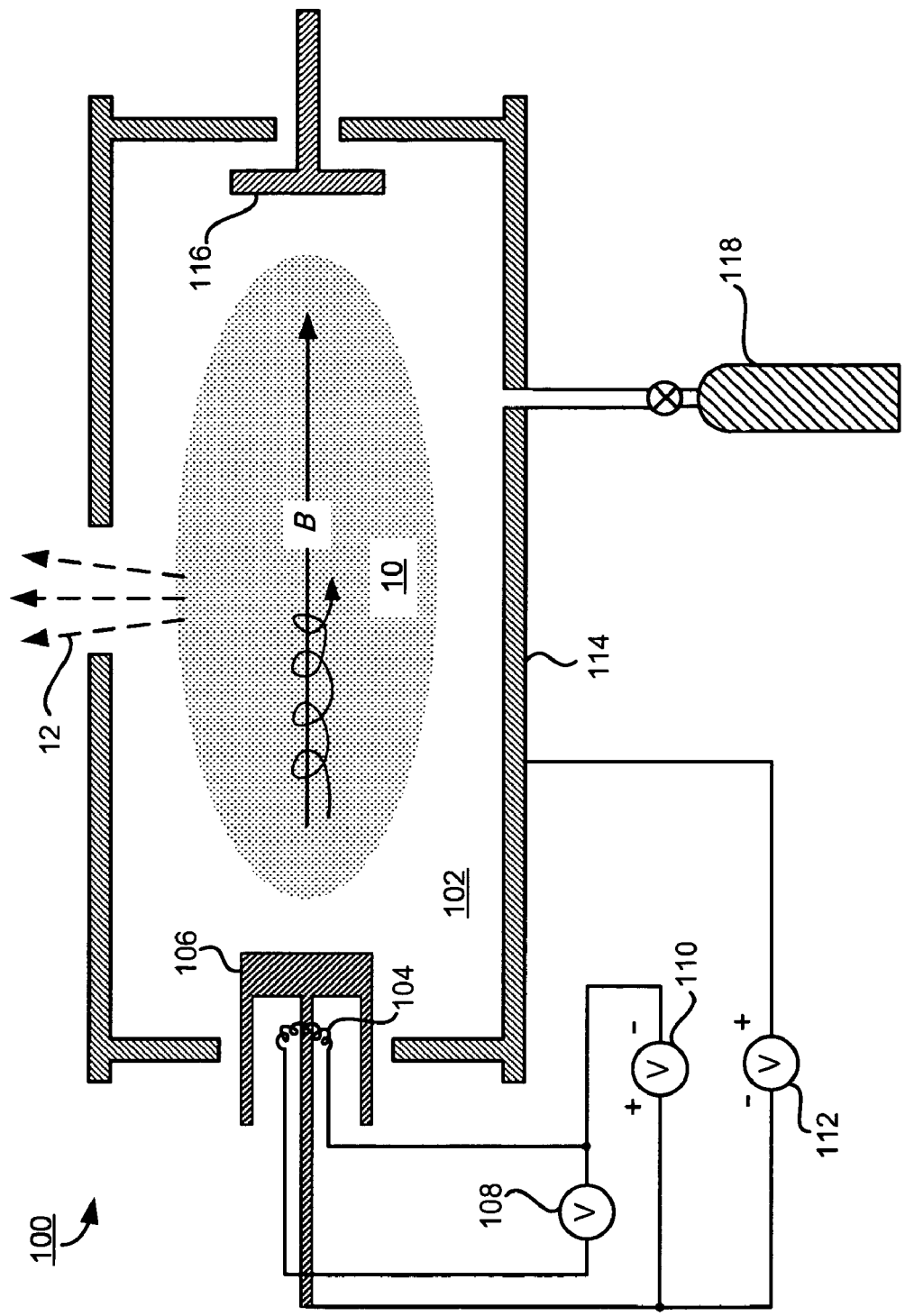
FIG. 1 shows a typical ion source in an ion implanter.

In step 202, an ion source chamber may be provided in an ion implanter. Preferably, the ion source chamber may be a plasma-based device such as, for example, the ion source chamber 102 shown in FIG. 1, although other types of ion source chambers (including non-plasma-based) are also contemplated.

In step 204, a first reactive species may be supplied to the ion source chamber. The first reactive species may comprise one or more ion-generating species as well as one or more diluent gases. For generation of carbon ions, the ion-generating species may comprise, for example, carbon dioxide ($CO_2$), carbon monoxide (CO), methane ($CH_4$), or a combination thereof. For generation of oxygen ions, the ion-generating species may comprise, for example, oxygen ($O_2$), carbon dioxide ($CO_2$), carbon monoxide (CO), or a combination thereof. Inert gases such as argon (Ar) and krypton (Kr) may be used as the diluent gases. According to one embodiment, the supply of the first reactive species may be achieved with a $CO_2$ flow of approximately 1.5-6.0 sccm combined with an Ar flow of approximately 0.1-2.0 sccm. "sccm" stands for "standard cubic centimeters per minute."

In step 206, ions (e.g., carbon ions or oxygen ions) for use in the ion implanter may be generated based on the first reactive species. In a plasma-based ion source chamber, a number of techniques may be employed to generate a plasma from the first reactive species. For example, a plasma may be generated in an arc chamber like the ion source chamber 102 shown in FIG. 1. Alternatively, electrical power (e.g., RF or microwave) may be capacitively or inductively coupled into the ion source chamber to generate the plasma. Ions may then be extracted from the plasma for use in the ion implanter.

In step 208, the supply of the first reactive species may be stopped, thereby halting ion generation in the ion source chamber. A hydrogen containing gas may then be supplied to the ion source chamber. The hydrogen containing gas may comprise one or more materials including, for example, phosphine ($PH_3$), ammonia ($NH_3$), arsine ($AsH_3$), and/or hydrogen ($H_2$). The hydrogen containing species may function mainly as a cleaning agent for the ion source chamber. In addition, one or more sputtering agents such as inert gases (e.g., argon or krypton) may be included in the hydrogen containing gas. Ions generated from the sputtering agents may sputter contaminant particles off the ion source chamber walls and extraction optics.

In step 210, a cleansing reaction may be created in the ion source chamber based on the hydrogen containing gas. The cleansing reaction may be created based on a technique that is similar to or different from the one used to generate ions in step 206. Preferably, the cleansing reaction may be created by generating a plasma from the hydrogen containing gas. The cleansing reaction may involve an interaction of the hydrogen containing gas with deposits accumulated in the ion source chamber due to the ion generation in step 206. The cleansing reaction may further involve a sputtering process, wherein particles of one or more sputtering agents (e.g., argon or krypton) may bombard the deposits off the ion source chamber walls. The cleansing reaction may be maintained for a specified period of time to remove unwanted deposits from the ion source chamber and/or to re-condition the ion source chamber.

In step 212, the supply of the hydrogen containing gas may be stopped, and a second reactive species may be supplied to the ion source chamber to generate ions. The second reactive species may or may not be the same as the first reactive species.

The specified period of time for maintaining the cleansing reaction in step 210 may be determined based on the type of the first reactive species and the length of the ion generation process in 206. For example, a longer ion generation process in 206 with a relatively more contaminant first reactive species (e.g., $CO_2$) may require a longer cleansing reaction in step 210. The specified period of time for maintaining the cleansing reaction may also depend on the type of the second reactive species. According to one embodiment, it is typical to run the cleaning for 15-60 minutes. Some reactive species are more sensitive to ion source chamber poisoning than others. For example, generation of carbon ions has a significant impact on a subsequent generation process of boron ions (e.g., approximately 50% reduction in beam current), compared to a moderate impact on a subsequent generation process of phosphorous ions (e.g., approximately 10% reduction in beam current) and a negligible effect on a subsequent generation process of arsenic ions. Therefore, after running carbon containing reactive species, if the next process generates boron ions, it may take longer to re-condition the ion source chamber than if the next process generates phosphorous ions.

The specified period of time for maintaining the cleansing reaction in step 210 may also be controlled based on a variety of endpoint detection methods such as, for example, mass spectrometry (MS), residual gas analysis (RGA), and/or emission/absorption spectroscopy. That is, while running a cleansing reaction, the reaction itself (e.g., plasma) and/or the reaction products (e.g., residual gases) may be monitored in substantial real-time to determine the presence and amount of contaminants in the ion source chamber. Once the amount of a contaminant has dropped below a predetermined level or become undetectable, an endpoint for the cleansing reaction may have been reached. For example, according to one embodiment, a mass spectrum may be taken of the plasma during a cleansing reaction that follows a carbon operation. An oxygen peak at mass/charge =16 may be a good indication of how well the cleaning is going for a subsequent boron operation. Once the oxygen peak has been sufficiently reduced, the cleansing reaction may be stopped and the boron operation may be started.

According to embodiments of the present disclosure, a chlorine containing gas may be used as a cleaning agent in place of the hydrogen containing gas described above. That is, after running ion generation in an ion source chamber, a chlorine containing gas may be flowed into the ion source chamber to generate a plasma. The plasma may react with unwanted compounds or deposits and remove them from the ion source chamber. The chlorine containing gas may comprise, for example, chlorine ($Cl_2$), hydrochloride (HCl), boron trichloride ($BCl_3$), or a combination thereof. In addition, one or more inert gases may be included in the chlorine containing gas as a sputtering agent.

Figure 3:
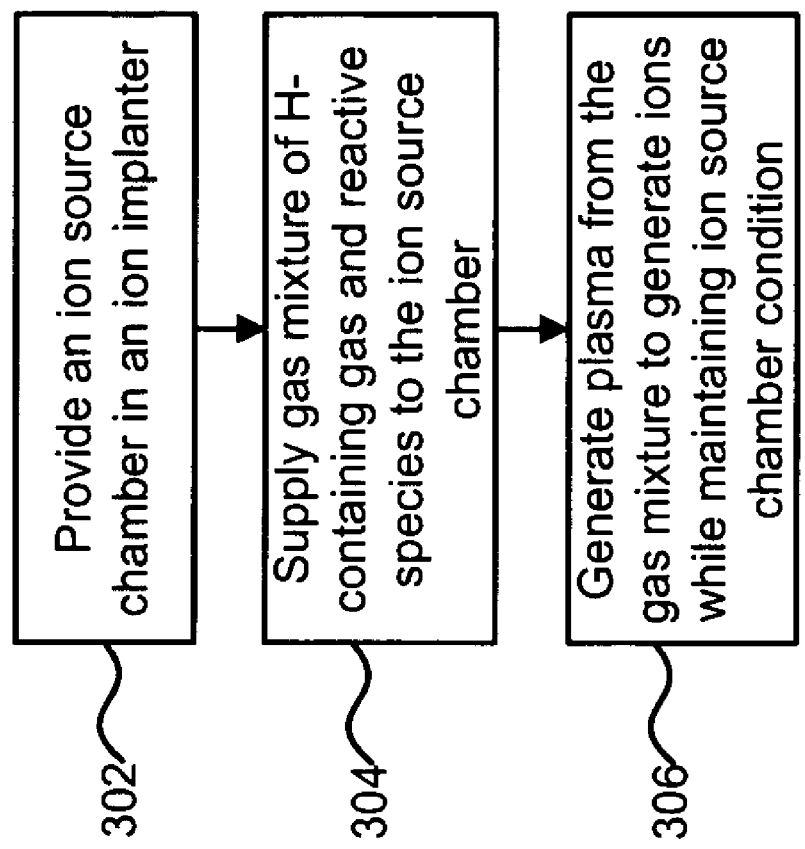
FIG. 3 shows a flow chart illustrating another exemplary method for improving ion implanter productivity in accordance with an embodiment of the present disclosure.

FIG. 3 shows a flow chart illustrating another exemplary method for improving ion implanter productivity in accordance with an embodiment of the present disclosure.

In step 302, an ion source chamber may be provided in an ion implanter. Preferably, the ion source chamber may be a plasma-based device such as, for example, the ion source chamber 102 shown in FIG. 1, although other types of ion source chambers (including non-plasma-based) are also contemplated.

In step 304, a mixture of a hydrogen containing gas and a reactive species may be supplied to the ion source chamber. The hydrogen containing gas and the reactive species may be fed to the ion source chamber concurrently, sequentially, or pre-mixed. The reactive species may comprise one or more ion-generating species as well as one or more sputtering agents such as, for example inert gases (e.g., argon or krypton). Typically, the mixture may comprise a greater amount of the reactive species than the hydrogen containing gas. According to one embodiment, the mixture may include 83% carbon dioxide, 8.5% argon, and 8.5% hydrogen, wherein the percentage is based on the respective flow rates of the three gases. According to another embodiment, carbon dioxide and hydrogen may be pre-mixed and supplied to the ion source chamber at a flow rate of approximately 1.0-6.0 sccm, while argon may be supplied at a flow rate of approximately 0.1-2.0 sccm.

In step 306, a plasma may be generated from the gas mixture to generate ions while maintaining a benign ion source chamber condition. In the plasma, the reactive species may generate ions for use in the ion implanter, while the hydrogen containing gas is mainly responsible for cleaning the ion source chamber. In addition, particles created from one or more inert gases in the gas mixture may sputter deposits off the ion source chamber walls and extraction optics. The simultaneous cleaning of the ion source chamber during ion generation may keep the ion source running longer before any maintenance is required.

Although the exact reasons for or mechanisms behind ion source "poisoning" are not fully understood in the art, it is believed that one contributing factor may be an accumulation of compounds that are formed as a by-product between ion-generating reactive species (e.g., oxygen) and certain metals (e.g. tungsten) inside the ion source chamber. For example, in an ion source chamber that uses a tungsten cathode and/or has a tungsten wall, it is believed that tungsten oxide ($WO_3$) or other tungsten compound(s) are formed during carbon operation. The accumulation of tungsten compound(s) may be particularly detrimental to a subsequent boron operation, because it is believed that a heated tungsten wall puts $BF_3$ molecules into an exited state and helps them to break up more easily. A tungsten wall masked with tungsten compounds such as $WO_3$ will reduce boron fractionation. Therefore, one effect of a hydrogen containing gas or a chlorine containing gas or a reducing agent may be to remove the metal compound(s) (e.g., $WO_3$) from the ion source chamber. It should be noted, however, that embodiments of the present disclosure or the scope of the claims are not limited to the above-described theory.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for improving productivity of an ion implanter having an ion source chamber, the method comprising the steps of:
   supplying a gaseous substance to the ion source chamber, the gaseous substance comprising one or more reactive species for generating ions for the ion implanter;
   stopping the supply of the gaseous substance to the ion source chamber; and
   supplying a hydrogen containing gas to the ion source chamber for a period of time after stopping the supply of the gaseous substance.

2. The method according to claim 1, further comprising:
   generating a plasma in the ion source chamber based on the one or more reactive species, thereby generating the ions.

3. The method according to claim 1, wherein the gaseous substance comprises reactive species selected from a group consisting of carbon dioxide ($CO_2$), carbon monoxide (CO), oxygen ($O_2$), and any type of hydrocarbon.

4. The method according to claim 1, further comprising:
   generating a plasma in the ion source chamber based on the hydrogen containing gas, thereby reconditioning the ion source chamber.

5. The method according to claim 1, wherein the hydrogen containing gas comprises one or more materials selected from a group consisting of phosphine ($PH_3$), ammonia ($NH_3$), arsine ($AsH_3$), methane ($CH_4$), and hydrogen ($H_2$).

6. The method according to claim 1, wherein the hydrogen containing gas further comprises a sputtering agent.

7. The method according to claim 6, wherein the sputtering agent comprises one or more inert gases.

8. The method according to claim 1, wherein the period of time for supplying the hydrogen containing gas is determined based at least in part on an amount of time during which the gaseous substance is supplied to the ion source chamber.

9. The method according to claim 1, further comprising:
   stopping supplying the hydrogen containing gas to the ion source chamber after the period of time; and
   supplying a second gaseous substance to the ion source chamber after stopping supplying the hydrogen containing gas;
   wherein the period of time is determined based at least in part on a composition of the second gaseous substance.

10. The method according to claim 9, wherein the second gaseous substance comprises one or more boron containing reactive species.

11. The method according to claim 1, wherein the period of time for supplying the hydrogen containing gas is determined based on one or more endpoint detection methods selected from a group consisting of mass spectrometry, residual gas analysis, emission spectroscopy, and absorption spectroscopy.

12. A method for improving productivity of an ion implanter having an ion source chamber, the method comprising the steps of:
   supplying a gaseous substance to the ion source chamber, the gaseous substance comprising one or more reactive species for generating ions for the ion implanter;
   stopping the supply of the gaseous substance to the ion source chamber; and
   supplying a chlorine containing gas to the ion source chamber for a period of time after stopping the supply of the gaseous substance.

13. The method according to claim 12, wherein the chlorine containing gas comprises one or more materials selected from a group consisting of chlorine ($Cl_2$), hydrochloride (HCl), boron trichloride ($BCl_3$) and indium trichloride ($BCl_3$).

14. A method for improving productivity of an ion implanter having an ion source chamber, the method comprising the steps of:
   supplying the ion source chamber with a gaseous mixture of a hydrogen containing gas and one or more reactive species; and
   generating a plasma in the ion source chamber based on the gaseous mixture, wherein the plasma contains ions generated from the one or more reactive species for use in the ion implanter, and wherein the plasma further removes one or more compounds from the ion source chamber.

15. The method according to claim 14, wherein the gaseous mixture further comprises a sputtering agent.

16. The method according to claim 15, wherein the sputtering agent comprises one or more inert gases.

17. The method according to claim 14, wherein the hydrogen containing gas comprises one or more materials selected from a group consisting of phosphine ($PH_3$), ammonia ($NH_3$), arsine ($AsH_3$), and hydrogen ($H_2$).

18. The method according to claim 14, wherein the hydrogen containing gas accounts for 5-40% of a volume of the gaseous mixture.

19. A method for improving productivity of an ion implanter having an ion source chamber, the method comprising the steps of:

supplying a gaseous substance to the ion source chamber, the gaseous substance comprising one or more reactive species for generating carbon ions for the ion implanter;

stopping the supply of the gaseous substance to the ion source chamber;

supplying a hydrogen containing gas to the ion source chamber for a period of time after stopping the supply of the gaseous substance, the hydrogen containing gas also comprising at least one sputtering agent; and generating a plasma based on the hydrogen containing gas, wherein the plasma removes one or more metal compounds from the ion source chamber.

* * * * *